United States Patent [19]

Orbach et al.

[11] Patent Number: 5,485,487
[45] Date of Patent: Jan. 16, 1996

[54] RECONFIGURABLE COUNTER AND PULSE WIDTH MODULATOR (PWM) USING SAME

[75] Inventors: Yair Orbach, Hashomron; Heinrich Iosub, Rishon; Effi Orian, Kfar, all of Israel

[73] Assignee: Motorola, Inc., Schaumburg, Ill.

[21] Appl. No.: 201,736

[22] Filed: Feb. 25, 1994

[51] Int. Cl.[6] ................................................. H03K 7/08
[52] U.S. Cl. ........................ 375/238; 370/9; 332/109
[58] Field of Search ................................. 375/22; 370/9; 328/111; 329/312; 332/109; 307/234

[56] References Cited

U.S. PATENT DOCUMENTS

| | | | |
|---|---|---|---|
| 3,510,780 | 5/1970 | Buehrle | 375/22 |
| 4,502,024 | 2/1985 | Nishikawa et al. | 375/22 |
| 4,550,307 | 10/1985 | Akashi et al. | 332/109 |
| 5,021,788 | 6/1991 | Ueki et al. | 341/152 |
| 5,070,312 | 12/1991 | Cho | 332/109 |
| 5,231,363 | 7/1993 | Sano et al. | 375/22 |
| 5,241,541 | 8/1993 | Farrell et al. | 370/94.1 |
| 5,298,871 | 3/1994 | Shimohara | 332/109 |

*Primary Examiner*—Stephen Chin
*Assistant Examiner*—T. Ghebretinsae
*Attorney, Agent, or Firm*—Paul J. Polansky

[57] ABSTRACT

A pulse width modulator (20) includes a reconfigurable counter (30) whose width is determined by mode control bits. In one embodiment, a decoder (24) decodes the mode control bits to provide decoded width control signals to the reconfigurable counter (30). The width control signals enable selected least significant counter cells (101–107) of the reconfigurable counter (30) in a binary-to-thermometer fashion. Thus, unused counter cells are disabled, reducing power. The pulse width modulator (20) also includes an output circuit (25) which provides a pulse width modulated output signal having a duty cycle determined by a proportion of a cycle of the reconfigurable counter (30) during which a comparator (23) detects that an output of the reconfigurable counter (30) has reached a value of an input number. A portion of the comparator (23) may also be disabled in response to the width control signals.

16 Claims, 6 Drawing Sheets

RECONFIGURABLE COUNTER AND PULSE WIDTH MODULATOR (PWM) USING SAME

CROSS-REFERENCE TO RELATED, COPENDING APPLICATION

Related subject matter is contained in a patent application entitled "Two's Complement Pulse Width Modulator and Method for Pulse Width Modulating a Two's Complement Number", Ser. No. 08/202,060, now U.S. Pat. No. 5,428, 639, issued Jun. 27, 1995, filed concurrently herewith and assigned to the assignee hereof.

FIELD OF THE INVENTION

This invention relates generally to electrical circuits, and more particularly, to counters and pulse Width modulators using counters.

BACKGROUND OF THE INVENTION

Pulse width modulators (PWMs) are useful for many applications including communications, control applications such as motor controllers, and the like. A PWM receives an input number and provides an output pulse whose duty cycle is determined by the input number. A typical PWM includes a counter which counts the number of cycles of a clock input signal, an input register for storing the input number, and a comparator which detects when the counter reaches the input number in order to switch the output signal.

One desirable feature of PWMs is the ability to vary the period of the pulse width modulated output signal. A PWM in which this period is made a power of two of the clock input signal is termed a "$2^n$ PWM", where n corresponds to the number of bits of the input number. There are two known techniques to vary the period of the PWM. One technique uses a free-running counter (i.e., one which is not periodically loaded) and transfers the output of a selected counter cell to the comparator according to control signals. Another technique loads the counter with a value which is a function of not only the input number but also of control signals. For this counter when the count reaches a value determined by the input number and control signals, it is automatically reloaded. Obviously, both these techniques require different types of counters and additional logic to recognize when the counter reaches a desired value, and the counter must be large enough to handle all possible cases, which increases power consumption. What is needed is a PWM with reduced area and improved performance.

SUMMARY OF THE INVENTION

Accordingly, the present invention provides, in one form, a reconfigurable counter including a first plurality of serially coupled counter cells. The first plurality of serially coupled counter cells is ordered from a most significant counter cell to a least significant counter cell. Each counter cell has a carry input, a clock input for receiving a clock input signal, an enable input, a carry output, and a parallel output. The enable input of each of the first plurality of serially coupled counter cells receives a corresponding one of a like plurality of decoded width signals. The carry input of the least significant counter cell is coupled to a reference voltage terminal of a predetermined logic state. The carry input of each of the first plurality of serially coupled counter cells besides the least significant counter cell is coupled to a carry output of a next less significant one of the first plurality of serially coupled counter cells. Each of the first plurality of serially coupled counter cells provides the carry output thereof in response to the carry input thereof when the enable input thereof is active. Each of the plurality of serially coupled counter cells provides the carry output thereof at a second predetermined logic state when the enable input thereof is inactive. The parallel output terminals of the first plurality of serially coupled counter cells collectively form an output of the reconfigurable counter.

In another form, the present invention provides a pulse width modulator including an input register, a reconfigurable counter, a comparator, and an output circuit. The input register has an input for receiving an input number, and an output. The reconfigurable counter has a clock input for receiving a clock input signal, a control input for receiving at least one decoded width signal, and an output for providing a counter output value. The reconfigurable counter has a counter width determined by the control input. The comparator has a first input coupled to the output of the input register, second input coupled to the output of the reconfigurable counter, and an output for providing an output signal in a predetermined logic state in response to the first and second inputs thereof being equal. The output circuit has an input coupled to the output of the comparator, and an output for providing a pulse width modulated output signal. The pulse width modulated signal has a duty cycle determined by a proportion of a period of the reconfigurable counter during which the comparator detects that the first and second inputs thereof are equal.

These and other features and advantages will be more clearly understood from the following detailed description taken in conjunction with the accompanying drawings.

DETAILED DESCRIPTION OF THE EMBODIMENT

Figure 1:
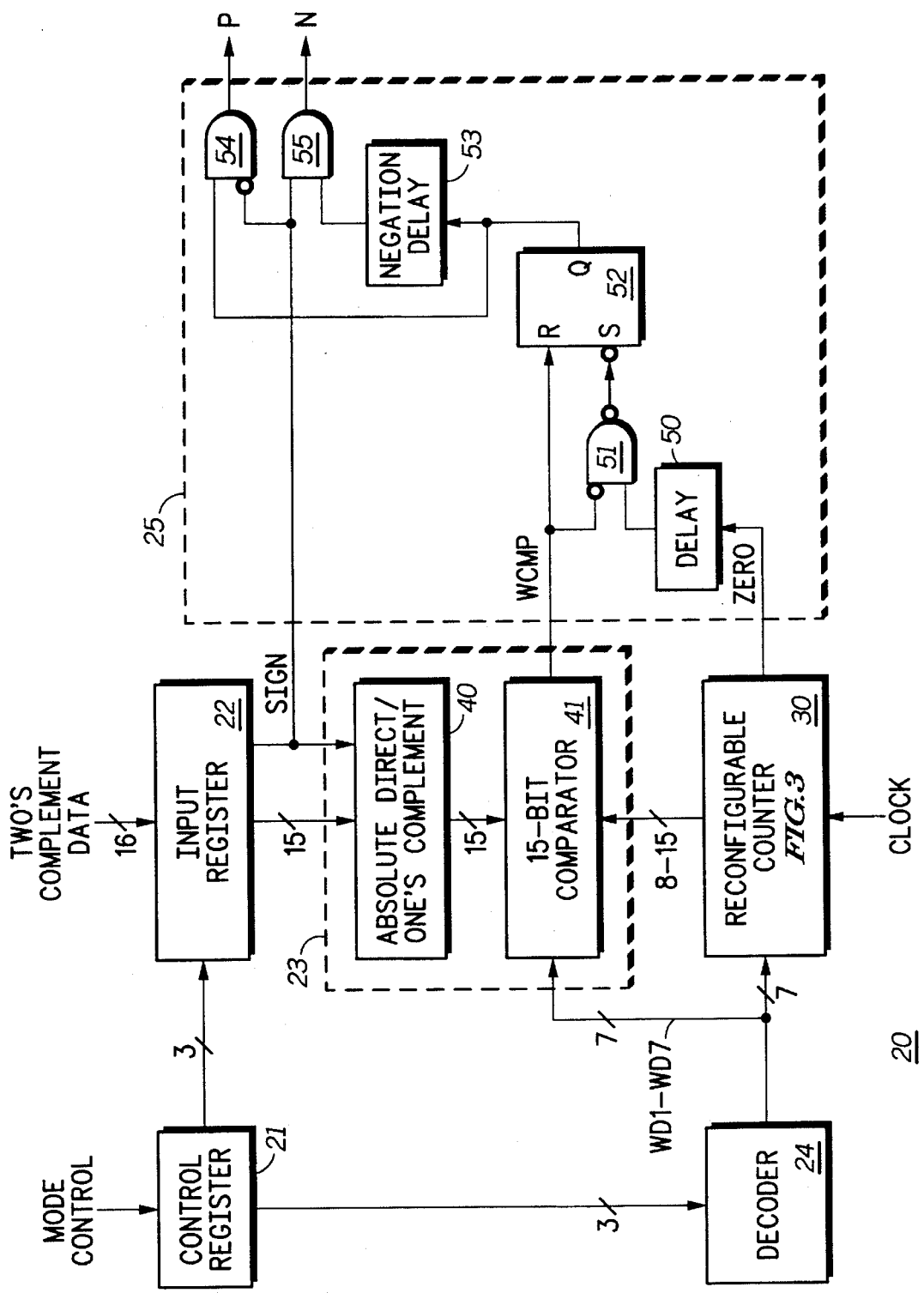
FIG. 1 illustrates in partial block diagram and partial logic diagram form a pulse width modulator (PWM) according to the present invention.

FIG. 1 illustrates in partial block diagram and partial logic diagram form a pulse width modulator (PWM) 20 according to the present invention. PWM 20 includes generally a control register 21, an input register 22, a comparator section 23, a decoder 24, an output circuit 25, and a reconfigurable counter 30. Mode control register 21 has an input for receiving a set of signals labelled "MODE CONTROL", a first output for providing three mode control signals to a control input of input register 22, and a second output for providing three other mode control signals to decoder 24. The three mode control signals provided to input register 22 are signals designated "R", "W", and "LD", for controlling the operation of input register 22. The three mode control signals provided to decoder 24 are signals designated "H", "M", and "L", representing the high or most-significant, the medium or next most-significant, and the low or least-significant bits of a 3-bit quantity which encodes a programmable size of counter 30. Mode control register 21 provides additional control signals, not shown, to control the operation of the various blocks of PWM 20, but their description is not important to understanding the present invention and thus they are omitted from the discussion.

Input register 22 has a data input for receiving a 16-bit input number labelled "TWO'S COMPLEMENT DATA", a control input for receiving the three mode control signals (R, W, and LD) from control register 21, a first 15-bit output connected to comparator section 23, and a second 1-bit output connected to comparator section 23 for provicting a signal labelled "SIGN". Input register 22 includes a register section and a latch section (not shown) which prevent the outputs from changing during use by comparator section 23. Signals R and W control the reading and writing of the register section, respectively. Signal LD controls the loading of the latch during a read of the counter section.

Comparator section 23 has a 15-bit input connected to the first output of input register 22, a first control input connected to the second output of input register 22 for receiving signal SIGN, a second control input for receiving seven control signals labelled "WD1–WD7" from decoder 24, and an output connected to an input of output circuit 25 for providing a signal labelled "WCMP". Comparator section 23 includes an absolute direct/one's complement block 40, and a 15-bit comparator 41. Block 40 has an input for receiving the 15-bit output from input register 22, a control input for receiving signal SIGN, and a 15-bit output. Block 40 selectively performs one's complementing (inversion) on the 15-bit input number based on the value of the SIGN bit. Block 40 is very efficient and quick because if the SIGN bit is negative (indicated by a binary 1), block 40 performs a one's complement operation on all of the bits in parallel in order to provide a quantity which represents the absolute value of TWO'S COMPLEMENT DATA minus one. If the SIGN bit is positive (indicated by a binary 0), block 40 passes the bits unaltered to the output. Note that block 40 does not convert a negative value number to its absolute value representation; rather, it finds the one's complement, which is a pulse width modulated signal labelled "N" for negative input numbers, and output circuit 25 later inserts an extra cycle into signal N to compensate for using the one's complement value. Thus, block 40 may be implemented simply, without an adder circuit having carry capability.

Comparator 41 is a 15-bit comparator whose width (number of bit positions compared) is controlled by signals WD1–WD7. Once comparator 41 is configured by signals WD1–WD7, if the selected bits of the input number equal the selected bits of the output of counter 30, then 15-bit comparator 41 activates signal WCMP.

Decoder 24 has an input for receiving the three control bits from control register 21 (H, M, and L), an output for providing signals WD1–WD7. Decoder 24 performs a binary-to-thermometer decoding of signals H, M, and L to provide signals WD1–WD7. For example, decoder 24 provides signal WD1 at a binary zero for all codes of HML besides 000; decoder 24 provides signal WD2 at a binary zero for all codes of HML besides 000 and 001; etc. The correspondence between H, M, and L and signals WD1–WD7 is shown in TABLE I below:

TABLE I

| H | M | L | WD7 | WD6 | WD5 | WD4 | WD3 | WD2 | WD1 |
|---|---|---|-----|-----|-----|-----|-----|-----|-----|
| 0 | 0 | 0 | 1 | 1 | 1 | 1 | 1 | 1 | 1 |
| 0 | 0 | 1 | 1 | 1 | 1 | 1 | 1 | 1 | 0 |
| 0 | 1 | 0 | 1 | 1 | 1 | 1 | 1 | 0 | 0 |
| 0 | 1 | 1 | 1 | 1 | 1 | 1 | 0 | 0 | 0 |
| 1 | 0 | 0 | 1 | 1 | 1 | 0 | 0 | 0 | 0 |
| 1 | 0 | 1 | 1 | 1 | 0 | 0 | 0 | 0 | 0 |
| 1 | 1 | 0 | 1 | 0 | 0 | 0 | 0 | 0 | 0 |
| 1 | 1 | 1 | 0 | 0 | 0 | 0 | 0 | 0 | 0 |

Reconfigurable counter 30 has a control input for receiving signals WD1–WD7, a clock input for receiving signal CLOCK, a parallel output for providing a count value whose width is reconfigurable from between 8 and 15 bits based on signals WD1–WD7, and an output for providing a signal labelled "ZERO" to an input of output circuit 25. Counter 30 provides signal ZERO when the outputs of selected ones of a set of fifteen counter cells are all zero, i.e., counter 30 has reached a terminal count and "rolled over".

Output circuit 25 has a first input for receiving signal SIGN, a second input for receiving signal WCMP, a third input for receiving signal ZERO, and first and second outputs for providing signals labelled "P" and "N", respectively. FIG. 1 illustrates a functional embodiment of output circuit 25 whose actual implementation will vary from embodiment to embodiment. In this functional embodiment, output circuit 25 includes a delay element 50, a ZNAND gate 51, a latch 52, a negation delay element 53, and AND gates 54 and 55. Delay element 50 has an input terminal for receiving signal ZERO, and an output terminal. NAND gate 51 has a complementary input terminal for receiving signal WCMP, a true input terminal connected to the output terminal of delay element 50, and an output terminal. Latch 52 has an active low set or "S" input terminal connected to the output terminal of NAND gate 51, an active high reset or "R" input terminal for receiving signal WCMP, and an output terminal labelled "Q" for providing an output signal thereof. Negation delay element 53 has an input terminal connected to the Q output terminal of latch 52, and an output terminal. AND gate 54 has a true input terminal connected to the Q output terminal of latch 52, a complementary input terminal connected to the second output terminal of input register 22 for receiving the SIGN bit, and an output terminal for providing signal P. AND gate 55 has a first input terminal connected to the second output terminal of input register 22 for receiving the SIGN bit, a second input terminal connected to the second output terminal of negation delay element 53, and an output terminal for providing signal N.

PWM 20 is a pulse width modulator which is responsive to set the pulse width of an output signal by receiving an input number (TWO'S COMPLEMENT DATA) in two's complement form. Thus, PWM 20 is suited to be directly connected to a data processing system bus. In particular, a class of data processors known as digital signal processors (DSPs) have arithmetic hardware to process data in two's complement form. Thus, PWM 20 is able to accept two complement data directly, without an intermediate conversion step.

In particular, certain DSPs operate on fractional two complement data, which has a value between 0 and 1, in which the most significant bit is the sign bit and less-significant bits correspond to a fractional power of two. One DSP, the 56000 DSP available from Motorola, Inc., has a 24-bit internal bus structure. Thus, PWM 20 may be connected to the 24-bit internal data bus by connecting input register 22 to the sixteen most-significant data bus lines. Thus, using fractional two's complement arithmetic, only the least significant fractional bits are not used by PWM 20.

PWM 20 also operates with reduced power from known PWMs by including reconfigurable counter 30, whose width is determined by bits in a control word. Counter 30 is able to disable the unused counter cells and thus to save power. For example, over a programmable range of from eight to fifteen bits, counter 30 counter will have an overall cycle as shown in TABLE II below:

TABLE II

| H | M | L | COUNTER WIDTH | PWM 20 CYCLE |
|---|---|---|---|---|
| 0 | 0 | 0 | 15 BITS | 32768 CLOCK CYCLES |
| 0 | 0 | 1 | 14 BITS | 16384 CLOCK CYCLES |
| 0 | 1 | 0 | 13 BITS | 8192 CLOCK CYCLES |
| 0 | 1 | 1 | 12 BITS | 4096 CLOCK CYCLES |
| 1 | 0 | 0 | 11 BITS | 2048 CLOCK CYCLES |
| 1 | 0 | 1 | 10 BITS | 1024 CLOCK CYCLES |
| 1 | 1 | 0 | 9 BITS | 512 CLOCK CYCLES |
| 1 | 1 | 1 | 8 BITS | 256 CLOCK CYCLES |

Comparator 41 also saves power by only comparing the input number to the output of counter 30 for those significant bit positions defined by signals WD1–WD7.

In comparator section 23, block 40 is also implemented efficiently, without the need for adder circuitry with carry capability. Thus, block 40 may be implemented with fifteen inverters and fifteen 2-to-1 multiplexers. In order to allow this simplification, output circuit 25 includes logic to insert an additional period during which signal N is active when the input number is a negative number.

Output circuit 25 provides two signals, N and P, which represent negative and positive pulse width modulated signals. These signals are useful, for example, for motor controllers in which separate signals control positive and negative displacements. Signal WCMP resets latch 52, which results in either signal P or signal N becoming active based of the value of signal SIGN. Delay element 50 prevents a race condition in which latch 52 simultaneously receives both set and reset pulses. Negation delay element 53 delays by one CLOCK cycle only the inactivation of its output, which occurs when its input transitions from an active to an inactive logic state. Thus, negation delay element 53 acts to inject an additional clock period during which signal N is active at a logic high, to compensate for block 40 performing a one's complement operation on a negative two's complement number.

Figure 2:
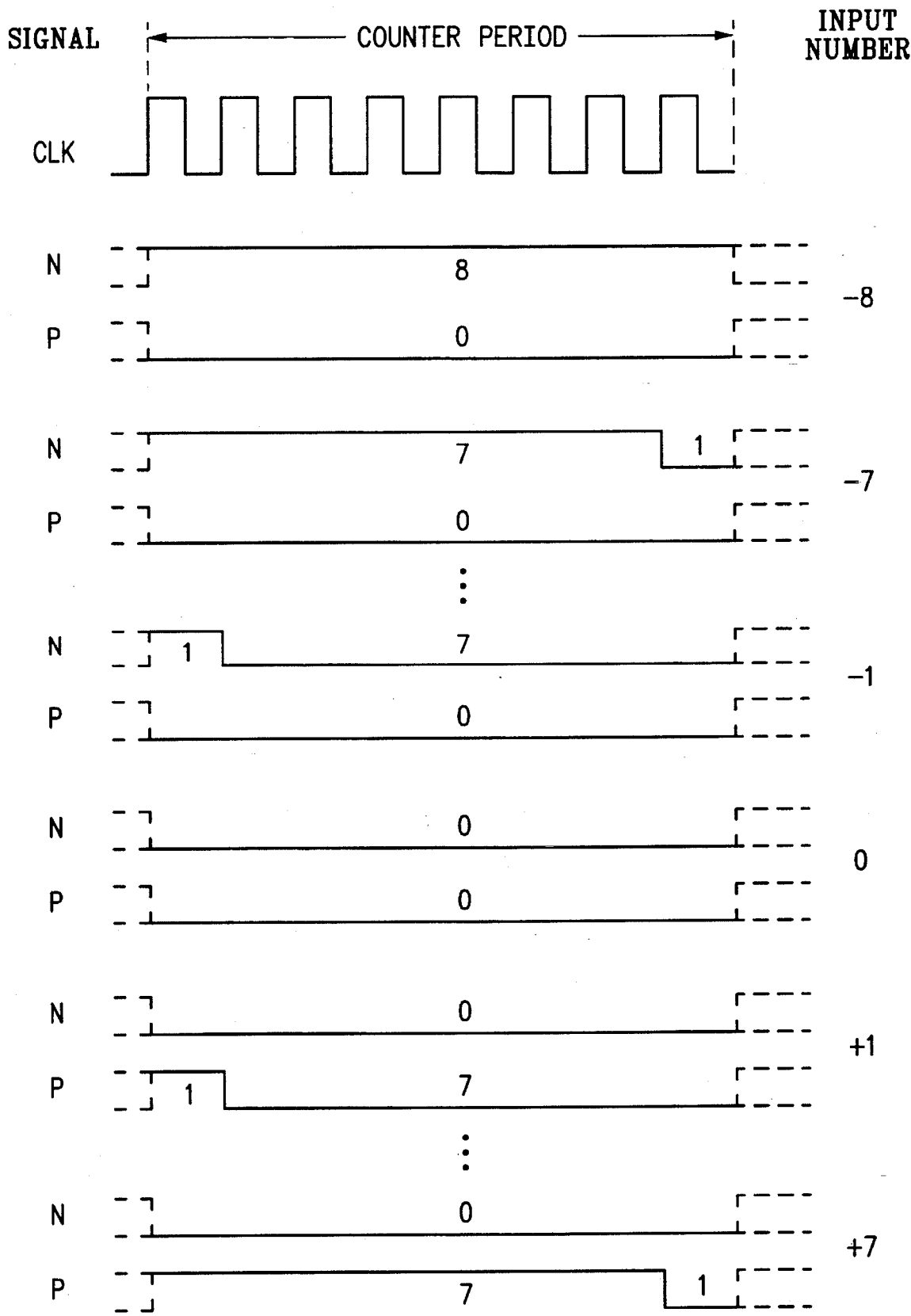
FIG. 2 illustrates a timing diagram of signals of the pulse width modulator of FIG. I useful in understanding the present invention.

FIG. 2 illustrates a timing diagram of signals of pulse width modulator 20 of FIG. 1 useful in understanding the present invention. FIG. 2 illustrates the case of 4-bit TWO'S COMPLEMENT DATA, which is useful in understanding the operation of PWM 20 using 16-bit TWO'S COMPLEMENT DATA. In the two's complement number system, four bits are able to represent numbers from −8 to +7. Signal N is a pulse width modulated output signal for a negative input number. For a four bit input number, the PWM has a period of eight (2(4-1)) clock cycles. When TWO'S COMPLEMENT DATA has a value of −8, signal N is provided at a logic high voltage for the entire period. For negative values, signal P is inactive at a logic low. When TWO's COMPLEMENT DATA is equal to −7, signal N is active for seven of the eight cycles of the period, and is inactive at a logic low for one cycle. This pattern repeats until, for an input number of −1, signal N is active for one clock cycle and inactive for seven clock cycles.

TWO'S COMPLEMENT DATA equal to zero is a special case, in which both signals N and P are inactive at a logic low. For positive values of TWO'S COMPLEMENT DATA, signal N is inactive at a logic low. For a value of TWO'S COMPLEMENT DATA of +1, signal P is active for one clock cycle, and inactive for seven clock cycles. When TWO'S COMPLEMENT DATA is equal to +2, signal P is active for two cycles and inactive for six cycles. This pattern continues until, when TWO'S COMPLEMENT DATA is equal to +7, signal P is active for seven clock cycles and inactive for one clock cycle. +7 is the largest positive number in the 4-bit two's complement numbering system.

This system has several advantages. First, PWM 20 is able to accept data directly from a data processor bus which conducts two's complement data. Second, signals P and N are available outputs to provide, for example, positive and negative displacements for motors or the like, and at the same time able to provide duty cycles from 0 to 100%.

Figure 3:
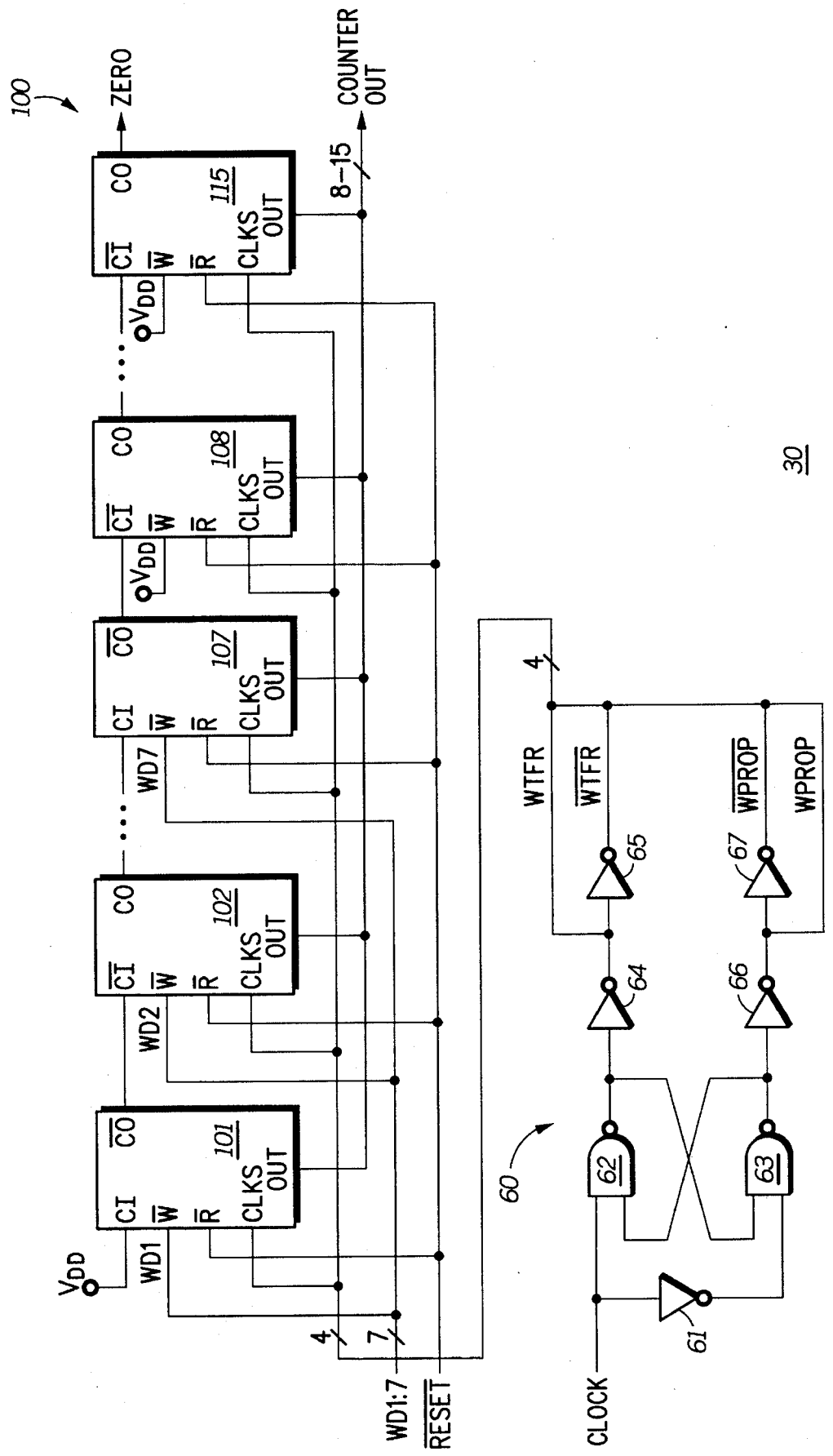
FIG. 3 illustrates in partial block diagram and partial logic diagram form the reconfigurable counter of FIG. 1.

FIG. 3 illustrates in partial block diagram and partial logic diagram form reconfigurable counter 30 of FIG. 1. Counter 30 includes generally a clock portion 60, and a counter portion 100. Clock portion 60 includes an inverter 61, NAND gates 62 and 63, and inverters 64–67. Inverter 61 has an input terminal for receiving signal CLOCK, and an output terminal. NAND gate 62 has a first terminal for receiving signal CLOCK, a second terminal, and an output terminal. NAND gate 63 has a first terminal connected to the output terminal of NAND gate 62, a second terminal connected to the output terminal of inverter 61, and an output terminal connected to the second input terminal of NAND gate 62. Inverter 64 has an input terminal connected to the output terminal of NAND gate 62, and an output terminal for providing a clock signal labelled "WTFR". Inverter 65 has an input terminal connected to the output terminal of inverter 64, and an output terminal for providing a clock signal labelled "$\overline{\text{WTFR}}$". Inverter 66 has an input terminal connected to the output terminal of NAND gate 63, and an output terminal for providing a clock signal labelled "WPROP". Inverter 67 has an input terminal connected to the output terminal of inverter 66, and an output terminal for providing a clock signal labelled "$\overline{\text{WPROP}}$".

Clock portion 60 receives signal CLOCK and latches it in a latch formed by cross-coupled NAND gates 62 and 63. The outputs of NAND gates 62 and 63 are then inverted once to form a true transfer signal WTFR and a true propagate signal WPROP. These signals are then each inverted to form a complementary transfer signal $\overline{\text{WTFR}}$ and a complementary propagate signal $\overline{\text{WPROP}}$, respectively. Together, these four signals form clock signals for the operation of counter portion 100.

Counter portion 100 includes fifteen counter cells 101–115, including counter cells 101, 102, 107, 108, and 115 illustrated in FIG. 3. Other counter cells are omitted but the illustrated counter cells are sufficient to illustrate the structure of the omitted counter cells. Each counter cell has a carry input terminal, a width input terminal labelled "$\overline{\text{W}}$", a reset input terminal labelled "$\overline{\text{R}}$" for receiving a reset input signal labelled "$\overline{\text{RESET}}$", four clock input terminals labelled "CLKS" and connected to the four outputs of clock portion 60, an output terminal labelled "OUT", and a carry out terminal. The carry input and output terminals for a given counter cell have opposite polarities, i.e., one is true and the other is complementary. Adjacent counter cells have opposite polarities as well. A first type of counter cell corresponding to the odd-order counter cells such as counter cells 101, 107, and 115, has a true carry input terminal labelled "CI" and a complementary carry output terminal labelled "$\overline{\text{CO}}$". A second type of counter cell corresponding to the even-order counter cells such as counter cells 102 and 108, has a complementary carry input terminal labelled "$\overline{\text{CI}}$" and a true carry output terminal labelled "CO".

Counter cell 101 is a least-significant counter cell and has a CI input terminal connected to a power supply voltage terminal labelled "$V_{DD}$", and a $\overline{\text{W}}$ input for receiving signal WD1. $V_{DD}$ is a more-positive power supply voltage terminal representative of an active-high logic level. Counter cell 102 has a $\overline{\text{CI}}$ input terminal connected to the $\overline{\text{CO}}$ output terminal of counter cell 101, and a $\overline{\text{W}}$ input terminal for receiving signal WD2. Counter cells 103–107 are connected together in this same way, with each counter cell receiving a corresponding one of decoded width signals WD1–WD7. Counter cells 108–115, however, have $\overline{\text{W}}$ input terminals which are connected to $V_{DD}$. Thus, signals WD1–WD7 selectively enable selected counter cells, while counter cells 108–115 are always active. Together, the output terminals of counter cells 101–115 form signal COUNTER OUTPUT, which will have a variable number of valid bits from 8–15 as determined by signals WD1–WD7.

Figure 4:
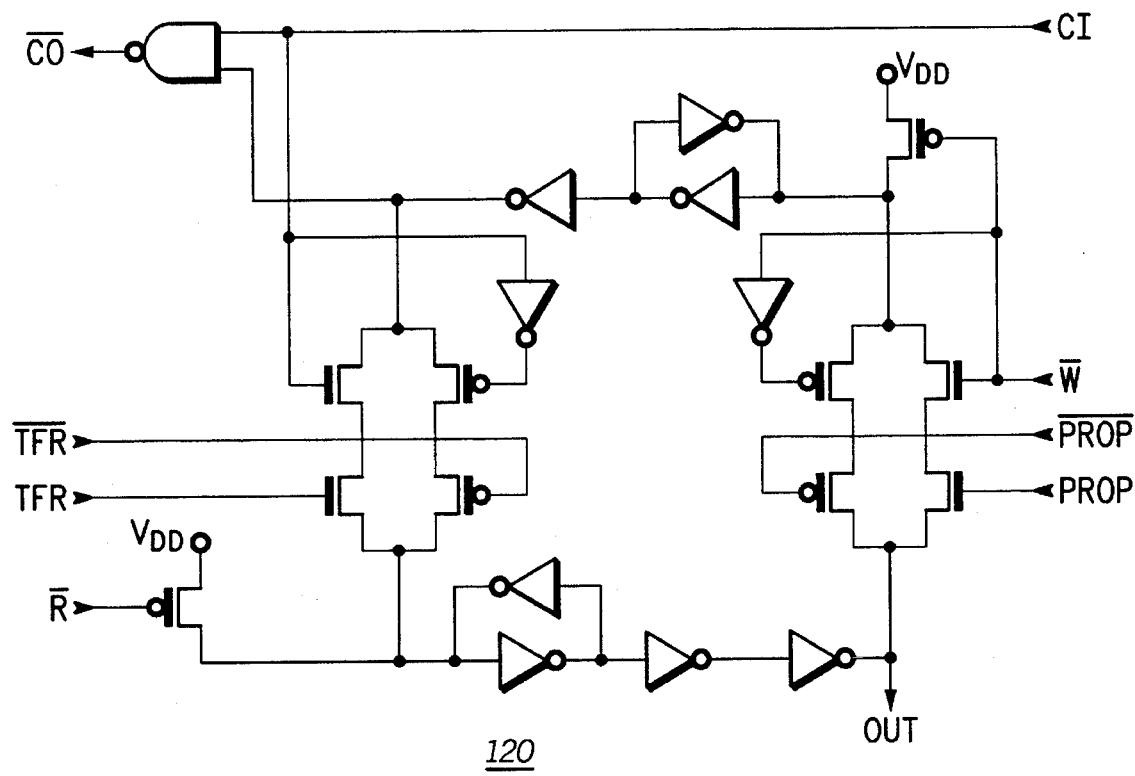
FIG. 4 illustrates in partial logic diagram and partial schematic form a first counter cell used in the counter of FIG. 3.

FIG. 4 illustrates in partial logic diagram and partial schematic form a first counter cell 120 used in counter 30 of FIG. 3. Counter cell 120 corresponds to each of the odd-order counter cells of counter 30. Counter cell 120 is implemented with a master/slave latch structure. Counter cell 120 is implemented using complementary metal-oxide-semiconductor (CMOS) transistors and logic gates. It should be apparent, however, counter cell 120 may be implemented with other available technologies and with other logic designs.

Figure 5:
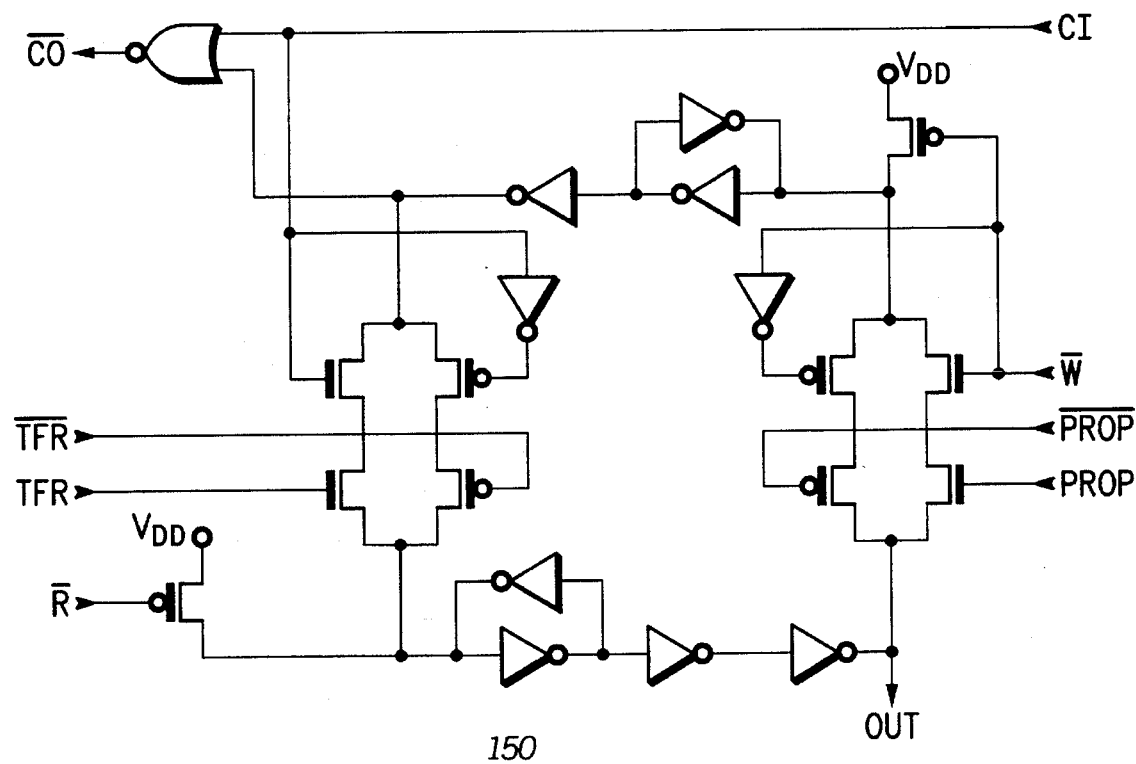
FIG. 5 illustrates in partial logic diagram and partial schematic form a second counter cell used in the counter of FIG. 3.

FIG. 5 illustrates in partial logic diagram and partial schematic form a second counter cell 150 used in counter 30 of FIG. 3. Counter cell 150 corresponds to each of the even-order counter cells of counter 30. Counter cell 150 is implemented with a master/slave latch structure. Counter cell 150 is implemented using CMOS transistors and logic gates. It should be apparent, however, that counter cell 150 may be implemented with other available technologies and with other logic designs.

Figure 6:
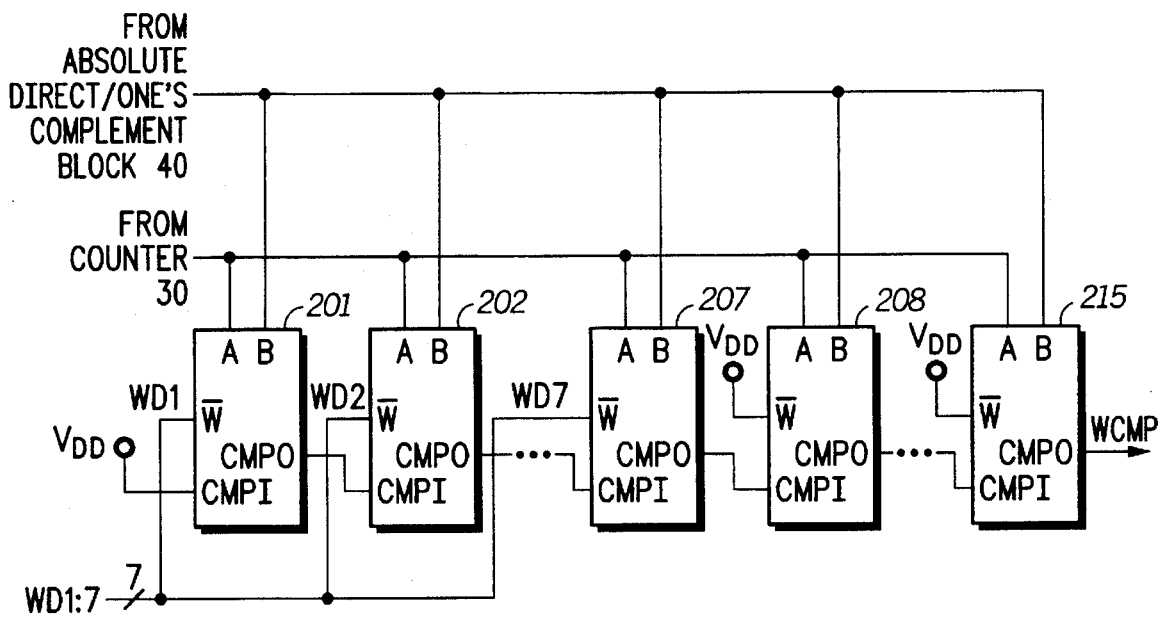
FIG. 6 illustrates in partial block diagram and partial logic diagram form the comparator of FIG. 1.

FIG. 6 illustrates in partial block diagram and partial logic diagram form comparator 41 of FIG. 1. Comparator 41 includes fifteen comparator cells 201–215, including comparator cells 201, 202, 207, 208, and 215 illustrated in FIG. 6. Other comparator cells are omitted but the illustrated counter cells are sufficient to illustrate the structure of the omitted comparator cells. Each comparator cell has a first or "A" input terminal for receiving a corresponding bit of the output of counter 30, a second or "B" input terminal receiving a corresponding bit of absolute direct/one's complement block 40, a $\overline{\text{W}}$ input terminal, a compare input terminal labelled "CMPI", and a compare output terminal labelled "CMPO". Comparator cells 201–207 each have a $\overline{\text{W}}$ input terminal for receiving a corresponding one of signals WD1–WD7. Comparator cells 208–215 each have a W input terminal connected to $V_{DD}$. Comparator cell 201 has a CMPI input terminal connected to $V_{DD}$. Each comparator cell besides comparator cell 201 has CMPI input terminal connected to a CMPO output terminal of next less-significant comparator cell. Comparator cell 215, the most-significant comparator cell, has a CMPO output terminal which provides signal WCMP, which is the output of comparator 41.

Figure 7:
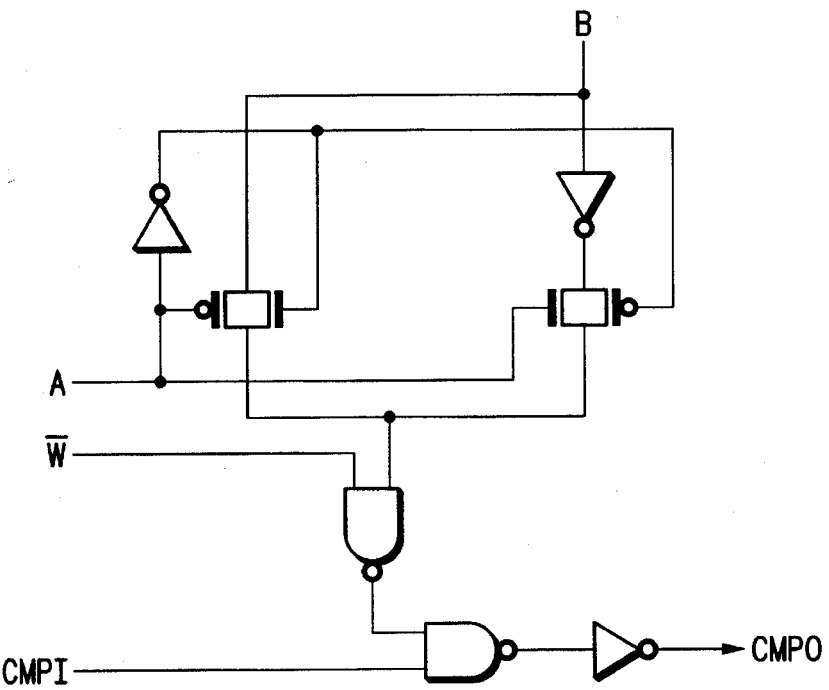
FIG. 7 illustrates in partial logic diagram and partial schematic form a comparator cell used in the comparator of FIG. 6.

FIG. 7 illustrates in partial logic diagram and partial schematic form comparator cell 201 used in comparator 41 of FIG. 6. Note that each comparator cell in comparator 41 is structurally identical to comparator cell 201. Comparator cell 201 is implemented using CMOS transistors and logic gates. It should be apparent, however, that comparator cell 201 may be implemented with other available technologies and with other logic designs.

Figure 8:
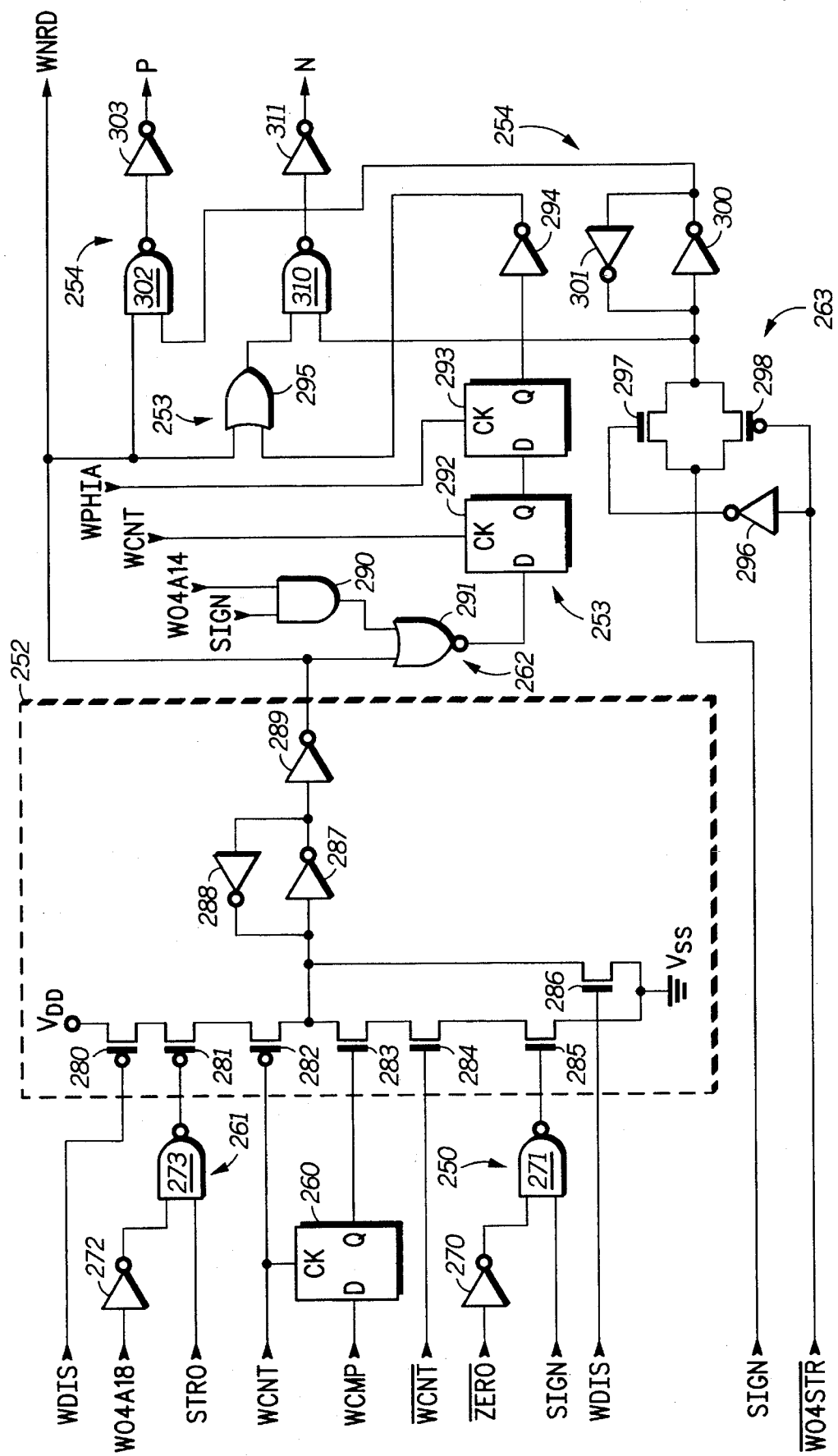
FIG. 8 illustrates in partial logic diagram and partial schematic form a preferred embodiment 250 of output circuit 25 of FIG. 1.

FIG. 8 illustrates in partial logic diagram and partial schematic form a preferred embodiment of output circuit 25 of FIG. 1. Output circuit 25 includes generally a delay portion 250, a latch 252, a negation delay portion 253, an AND logic circuits 254 and 255, a D type flip flop 260, correction circuits 261 and 262, and a synchronizer 263. Additional signals besides those previously described as received as inputs to FIG. 8, and their functions are described in TABLE III below:

TABLE III

| SIGNAL NAME | DESCRIPTION |
| --- | --- |
| W04A18 | A sample of signal WCMP used to avoid setting latch 252 if it was equal to counter 30 when the value of counter 30 is zero |
| STRO | A start signal which sets latch 252 when counter 30 starts |
| $\overline{\text{W04STR}}$ | Complement of signal STRO |
| WCNT | Clock signal of counter 30 |
| $\overline{\text{WCNT}}$ | Complement of signal WCNT |
| WPHIA | Pulse width modulator 20 clock signal, which connects signal PROP to the input of cells in counter 30 |
| W04A14 | A pre-start signal indicating a clock cycle should start |
| WDIS | Disable signal which causes reset of internal state |

Delay portion 250 includes an inverter 270 and a NAND gate 271. Inverter 270 has an input terminal for receiving an active low version of signal ZERO labelled "$\overline{\text{ZERO}}$", and an output terminal. NAND gate 271 has a first input terminal connected to the output terminal of inverter 270, a second input terminal for receiving signal SIGN, and an output terminal. Inverter 270 and NAND gate 271 together provide a delay and portion 250 serves to prevent spikes when a negative input number follows a 100% duty cycle input number. Flip flop 260 has a D input terminal for receiving signal WCMP, a CK input terminal for receiving signal WCNT, and a Q output terminal.

Correction circuit 261 includes an inverter 272 and a NAND gate 273. Inverter 272 has an input terminal for receiving signal W04A18, and an output terminal. NAND gate 273 has a first input terminal connected to the output terminal of inverter 272, a second input terminal for receiving signal STRO, and an output terminal. Correction circuit 261 operates to prevent spikes when the input number is zero.

Latch 252 has three active-low set input terminals, three active-high reset terminals, a latch reset input terminal, and an output terminal, and includes P-channel transistors 280–282, N-channel transistors 283–286, and inverters 287–289. Transistor 280 has a source connected to $V_{DD}$, a gate for receiving signal WDIS and forming the first set input terminal, and a drain. Transistor 281 has a source connected to the drain of transistor 280, a gate connected to the output terminal of NAND gate 273 and forming the second set input terminal, and a drain. Transistor 282 has a source connected to the drain of transistor 281, a gate for receiving signal WCNT and forming the third set input terminal, and a drain. Transistor 283 has a drain connected to the drain of transistor 282, a gate connected to the Q output terminal of flip flop 260 and forming the first reset input terminal, and a source. Transistor 284 has a drain connected to the source of transistor 283, a gate for receiving signal $\overline{WCNT}$ and forming the second reset input terminal, and a source. Transistor 285 has a drain connected to the source of transistor 284, a gate connected to the output terminal of NAND gate 271 and forming the third reset input terminal, and a source connected to a power supply voltage terminal labelled "$V_{SS}$". $V_{SS}$ is a more-negative power supply voltage terminal having a nominal voltage of approximately zero volts. Transistor 286 has a drain connected to the drain of transistor 282, a gate for receiving signal WDIS and forming the latch reset input terminal, and a source connected to $V_{SS}$. Inverter 287 has an input terminal connected to the drain of transistor 282, and an output terminal. Inverter 288 has an input terminal connected to the output terminal of inverter 287, and an output terminal connected to the input terminal of inverter 287. Inverter 289 has an input terminal connected to the output terminal of inverter 287, and an output terminal forming the output terminal of latch 252 and providing an output signal labelled "WNRD". Latch 252 latches a logic high voltage or "1" and provides its output at a logic high in response to all three voltages at the set input terminals being active at a logic low. Latch 252 latches a logic low voltage or "0" and provides its output at a logic low in response to all three voltages at the reset input terminals being active at a logic high. Signals WCNT and $\overline{WCNT}$ ensure that latch 252 is not both setting and resetting at the same time.

Correction circuit 262 includes an AND gate 290 and a NOR gate 291. AND gate 290 has a first input terminal for receiving signal SIGN, a second input terminal for receiving signal W04A14, and an output terminal. NOR gate 291 has an input terminal connected to the output terminal of AND gate 290, a second input terminal connected to the output terminal of latch 252, and an output terminal. Correction circuit 262 operates to inject one cycle when the input number is equal to FFFF hexadecimal ($FFFF).

Negation delay portion 253 includes D type flip flops 292 and 293, an inverter 294, and an OR gate 295. Flip flop 292 has a D input terminal connected to the output terminal of NOR gate 291, a CK input terminal for receiving signal WCNT, and a Q output terminal. Flip flop 293 has a D input terminal connected to the Q output terminal of flip flop 292, a CK input terminal for receiving signal WPHIA, and a Q output terminal. Inverter 294 has an input terminal connected to the output terminal of flip flop 293, and an output terminal. OR gate 295 has a first input terminal connected to the output terminal of inverter 294, a second input terminal connected to the Q output terminal of latch 252, and an output terminal. Negation delay portion 253 provides no delay on the activation of signal N but a one CLOCK cycle delay on the inactivation of signal N.

Synchronizer 263 includes an inverter 296, an N-channel transistor 297, and a P-channel 298. Inverter 296 has an input terminal for receiving signal $\overline{W04STR}$, and an output terminal. Transistor 297 has a first source/drain terminal for receiving signal SIGN, a gate connected to the output terminal of inverter 296, and a second source/drain terminal. Transistor 298 has a first source/drain terminal for receiving signal SIGN, a gate for receiving signal $\overline{W04STR}$, and a second source/drain terminal connected to the second source/drain terminal of transistor 297. Transistors 297 and 298 collectively form a transmission gate and the designation of which terminal is the source and which is the drain depends on the voltages applied. Synchronizer 263 serves to update signal SIGN to AND logic circuits 254 and 255 only on the activation of signal $\overline{W04STR}$.

AND logic circuit 254 includes inverters 300 and 301, a NAND gate 310, and an inverter 311. Inverter 300 has an input terminal connected to the second source/drain terminals of transistors 297 and 298, and an output terminal. Inverter 301 has an input terminal connected to the output terminal of inverter 300, and an output terminal connected to the input terminal of inverter 300. NAND gate 302 has a first input terminal connected to the Q output terminal of latch 252, a second input terminal connected to the output terminal of inverter 301, and an output terminal. Inverter 303 has an input terminal connected to the output terminal of NAND gate 302, and an output terminal for providing signal P. Together, inverters 300 and 301, NAND gate 302, and inverter 303 function as a latching AND gate with a true first input and a complementary second input.

AND logic circuit 255 includes a NAND gate 310, and an inverter 311. NAND gate 310 has a first input terminal connected to the output terminal of OR gate 295, a second input terminal connected to the second source/drain input terminals of transistors 297 and 298, and an output terminal. Inverter 303 has an input terminal connected to the output terminal of NAND gate 310, and an output terminal for providing signal N. Together, NAND gate 310 and inverter 311 function as an AND gate with two true inputs.

It should be apparent that output circuit 25 illustrated in FIG. 8 is just one possible output circuit which may be used in PWM 20 of FIG. 1. However, it should be noted that any output circuit preferably has the corrections provided by correction circuits 261 and 262. Furthermore, while it is possible to include a full two's complement to absolute value converter circuit, it is preferable to perform one's complementing and provide an added cycle delay to signal N as provided by negation delay portion 253.

While the invention has been described in the context of a preferred embodiment, it will be apparent to those skilled in the art that the present invention may be modified in numerous ways and may assume many embodiments other than that specifically set out and described above. For example, the counter described herein may be any arbitrary size. In addition, the pulse width modulator may be implemented in a variety of technologies. The function of output circuit 25 may also be implemented with different logic than that shown. Accordingly, it is intended by the appended claims to cover all modifications of the invention which fall within the true spirit and scope of the invention.

We claim:

1. A pulse width modulator comprising:

an input register having an input for receiving an input number, and an output;

a reconfigurable counter having a clock input for receiving a clock input signal, a control input for receiving at least one decoded width signal, and an output for providing a counter output value, said reconfigurable counter having a counter width determined by said control input;

a comparator having a first input coupled to said output of said input register, a second input coupled to said output of said reconfigurable counter, and an output for providing an output signal in a predetermined logic state in response to said first and second inputs thereof being equal; and an output circuit having an input coupled to said output of said comparator, and an output for providing a pulse width modulated output signal having a duty cycle determined by a proportion of a period of said reconfigurable counter during which said comparator detects that said first and second inputs thereof are equal.

2. The pulse width modulator of claim 1 further comprising:

a mode control register having an input for receiving at least one mode control signal, and an output; and a decoder having an input coupled to said output of said mode control register, and an output coupled to said control input of said reconfigurable counter (30) for providing said at least one decoded width signal thereto.

3. The pulse width modulator of claim 2 wherein said reconfigurable counter comprises:

a first plurality of serially coupled counter cells ordered from a most significant counter cell to a least significant counter cell, each of said first plurality of serially coupled counter cells having a carry input, a clock input for receiving said clock input signal, an enable input, a carry output, and a parallel output;

said enable input of each of said first plurality of serially coupled counter cells receiving a corresponding one of said at least one decoded width signal;

said carry input of said least significant counter cell coupled to a reference voltage terminal associated with a first predetermined logic state;

said carry input of each of said first plurality of serially coupled counter cells besides said least significant counter cell coupled to a carry output of a corresponding next less significant one of said first plurality of serially coupled counter cells;

each of said first plurality of serially coupled counter cells providing said carry output thereof in response to said carry input thereof when said enable input thereof is active, and providing said carry output thereof at a predetermined logic level when said enable input thereof in inactive;

said parallel outputs of said first plurality of serially coupled counter cells selectively forming a first portion of said counter output value as determined by said at least one decoded width signal.

4. The pulse width modulator of claim 3, wherein said carry input of each of said first plurality of serially coupled counter cells has an active logic level opposite to said carry output thereof.

5. The pulse width modulator of claim 3 wherein said reconfigurable counter further comprises:

a second plurality of serially coupled counter cells, ordered from a most significant counter cell to a least significant counter cell, each of said second plurality of serially coupled counter cells having a carry input, a clock input for receiving said clock input signal, an enable input, a carry output, a parallel output;

said enable input of each of said second plurality of serially coupled counter cells receiving a reference voltage indicative of an active logic state;

said carry input of said least significant counter cell of said second plurality of serially coupled counter cells coupled to said carry output of said most significant counter cell of said first plurality of serially coupled counter cells;

said carry input of each of said second plurality of serially coupled counter cells besides said least significant counter cell of said second plurality of serially coupled counter cells coupled to a carry output of a corresponding next less significant counter cell; and said parallel outputs of said second plurality of serially coupled counter cells collectively forming a second output of said reconfigurable counter.

6. The pulse width modulator of claim 2 wherein said comparator further has a control input coupled to said output of said decoder for receiving said at least one decoded width signal, said comparator providing said output signal thereof responsive to like portions of said first and second inputs, determined by said at least one decoded width signal, being equal to each other.

7. The pulse width modulator of claim 6 wherein said comparator comprises:

a first plurality of serially coupled comparator cells ordered from a most significant comparator cell to a least significant comparator cell, each of said first plurality of serially coupled comparator cells having a compare input, an enable input, a first data input coupled to a corresponding bit of said output of said reconfigurable counter, a second data input coupled to a corresponding bit of said output of said input register, and a compare output;

said enable input of each of said first plurality of serially coupled comparator cells receiving a corresponding one of said at least one decoded width signal;

said compare input of said least significant comparator cell coupled to a reference voltage terminal associated with a first predetermined logic state;

said compare input of each of said first plurality of serially coupled comparator cells besides said least significant comparator cell coupled to a compare output of a next less significant one of said first plurality of serially coupled comparator cells;

each of said first plurality of serially coupled comparator cells providing said compare output thereof in response to said first and second data inputs thereof being equal when said enable input thereof is active, and providing said compare output thereof at a predetermined logic level when said enable input thereof in inactive;

said compare output of said most significant comparator cell of said first plurality of serially coupled comparator cells forming an output of said comparator.

8. The pulse width modulator of claim 7 wherein said comparator further comprises:

a second plurality of serially coupled comparator cells, ordered from a most significant comparator cell to a least significant comparator cell, each of said second plurality of serially coupled comparator cells having a compare input, an enable input, a first data input coupled to a corresponding bit of said output of said reconfigurable counter, a second data input coupled to a corresponding bit of said output of said input register, and a compare output;

said enable input of each of said second plurality of serially coupled comparator cells receiving a reference voltage indicative of an active logic state;

said compare input of said least significant comparator cell of said second plurality of serially coupled comparator cells coupled to said compare output of said most significant comparator cell of said first plurality of serially coupled comparator cells;

said compare input of each of said second plurality of serially coupled comparator cells besides said least significant comparator cell of said second plurality of serially coupled comparator cells coupled to a compare output of a corresponding next less significant comparator cell; and said compare output of said most significant comparator cell of said second plurality of serially coupled comparator cells providing said output signal of said comparator.

9. A pulse width modulator comprising:

an input register having an input for receiving an input number, and an output;

a counter having a clock input for receiving a clock input signal, and an output for providing a counter output value;

a comparator having a first input coupled to said output of said input register, a second input coupled to said output of said counter, a control input for receiving at least one decoded width signal, and an output for providing an output signal in a predetermined logic state in response to a predetermined portion of said first and second inputs thereof being equal, said predetermined portion determined by said at least one decoded width signal; and an output circuit having an input coupled to said output of said comparator, and an output for providing a pulse width modulated output signal having a duty cycle determined by a proportion of a period of the pulse width modulator during which said comparator detects that said first and second inputs thereof are equal.

10. The pulse width modulator of claim 9 further comprising:

a mode control register having an input for receiving at least one mode control bit, and an output; and a decoder having an input coupled to said output of said mode control register, and an output coupled to said control input of said comparator for providing said at least one decoded width signal thereto.

11. The pulse width modulator of claim 10 wherein said counter further has a control input coupled to said output of said decoder for receiving said at least one decoded width signal, said counter having a counter width determined by said control input.

12. The pulse width modulator of claim 11 wherein said counter comprises:

a first plurality of serially coupled counter cells ordered from a most significant counter cell to a least significant counter cell, each of said first plurality of serially coupled counter cells having a carry input, a clock input for receiving said clock input signal, an enable input, a carry output, and a parallel output;

said enable input of each of said first plurality of serially coupled counter cells receiving a corresponding one of said at least one decoded width signal;

said carry input of said least significant counter cell coupled to a reference voltage terminal associated with a first predetermined logic state;

said carry input of each of said first plurality of serially coupled counter cells besides said least significant counter cell coupled to a carry output of a corresponding next less significant one of said first plurality of serially coupled counter cells;

each of said first plurality of serially coupled counter cells providing said carry output thereof in response to said carry input thereof when said enable input thereof is active, and providing said carry output thereof at a predetermined logic level when said enable input thereof in inactive;

said parallel outputs of said first plurality of serially coupled counter cells selectively forming a first portion of said counter output value as determined by said at least one decoded width signal.

13. The pulse width modulator of claim 12, wherein said carry input of each of said first plurality of serially coupled counter cells has an active logic level opposite to said carry output thereof.

14. The pulse width modulator of claim 12 wherein said counter further comprises:

a second plurality of serially coupled counter cells, ordered from a most significant counter cell to a least significant counter cell, each of said second plurality of serially coupled counter cells having a carry input, a clock input for receiving said clock input signal, an enable input, a carry output, a parallel output;

said enable input of each of said second plurality of serially coupled counter cells receiving a reference voltage indicative of an active logic state;

said carry input of said least significant counter cell of said second plurality of serially coupled counter cells coupled to said carry output of said most significant counter cell of said first plurality of serially coupled counter cells;

said carry input of each of said second plurality of serially coupled counter cells besides said least significant counter cell of said second plurality of serially coupled counter cells coupled to a carry output of a corresponding next less significant counter cell; and said parallel outputs of said second plurality of serially coupled counter cells collectively forming a second portion of said counter output value.

15. The pulse width modulator of claim 10 wherein said comparator comprises:

a first plurality of serially coupled comparator cells ordered from a most significant comparator cell to a least significant comparator cell, each of said first plurality of serially coupled comparator cells having a compare input, an enable input, a first data input coupled to a corresponding bit of said output of said counter, a second data input coupled to a corresponding bit of said output of said input register, and a compare output;

said enable input of each of said first plurality of serially coupled comparator cells receiving a corresponding one of said at least one decoded width signal;

said compare input of said least significant comparator cell coupled to a reference voltage terminal associated with a first predetermined logic state;

said compare input of each of said first plurality of serially coupled comparator cells besides said least significant comparator cell coupled to a compare output of a corresponding next less significant one of said first plurality of serially coupled comparator cells;

each of said first plurality of serially coupled comparator cells providing said compare output thereof in response to said first and second data inputs thereof being equal when said enable input thereof is active, and providing said compare output thereof at a predetermined logic level when said enable input thereof in inactive;

said compare output of said most significant comparator cell of said first plurality of serially coupled comparator cells forming an output of said comparator.

16. The pulse width modulator of claim 15 wherein said comparator further comprises:

a second plurality of serially coupled comparator cells, ordered from a most significant comparator cell to a least significant comparator cell, each of said second plurality of serially coupled comparator cells having a compare input, an enable input, a first data input coupled to a corresponding bit of said output of said counter, a second data input coupled to a corresponding bit of said output of said input register, and a compare output;

said enable input of each of said second plurality of serially coupled comparator cells receiving a reference voltage indicative of an active logic state;

said compare input of said least significant comparator cell of said second plurality of serially coupled comparator cells coupled to said compare output of said most significant comparator cell of said first plurality of serially coupled comparator cells;

said compare input of each of said second plurality of serially coupled comparator cells besides said least significant comparator cell of said second plurality of serially coupled comparator cells coupled to a compare output of a corresponding next less significant comparator cell; and said compare output of said most significant comparator cell of said second plurality of serially coupled comparator cells providing said output signal of said comparator.

* * * * *

UNITED STATES PATENT AND TRADEMARK OFFICE
CERTIFICATE OF CORRECTION

PATENT NO. : 5,485,487
DATED : Jan. 16, 1996
INVENTOR(S) : Yair Orbach et al.

It is certified that error appears in the above-identified patent and that said Letters Patent is hereby corrected as shown below:

Column 11, line 26, after "counter" delete [(30)].

Signed and Sealed this

Ninth Day of July, 1996

Attest:

BRUCE LEHMAN

*Attesting Officer*  *Commissioner of Patents and Trademarks*